United States Patent [19]

Calviello et al.

[11] Patent Number: 5,010,036
[45] Date of Patent: Apr. 23, 1991

[54] LOW TEMPERATURE SEMICONDUCTOR BONDING PROCESS WITH CHEMICAL VAPOR REACTION

[75] Inventors: Joseph A. Calviello, Kings Park; Grayce A. Hickman, Hicksville, both of N.Y.

[73] Assignee: Eaton Corporation, Cleveland, Ohio

[21] Appl. No.: 511,588

[22] Filed: Apr. 20, 1990

[51] Int. Cl.$^5$ .................... H01L 21/268; H01L 21/58
[52] U.S. Cl. .................................. 437/173; 437/209; 437/943
[58] Field of Search ............... 437/209, 936, 943, 173; 29/831, 832; 156/60, 272.2, 272.8, 273.3, 273.9, 379.6, 379.7, 380.9, 381, 497, 499; 228/123; 250/492.2; 357/80; 361/417

[56] References Cited

U.S. PATENT DOCUMENTS 4,483,725 11/1984 Chang ................................ 437/173
4,569,855 2/1986 Matsuda et al. .................... 437/173

FOREIGN PATENT DOCUMENTS 57-202740 12/1982 Japan .................................. 437/173
59-163831 9/1984 Japan .................................. 437/173
60-216556 10/1985 Japan .................................. 437/173
1257336 10/1989 Japan .................................. 437/173

OTHER PUBLICATIONS

"Laser-Direct-Writing Processes: Metal Deposition, Etching, and Applications to Microcircuits", Jerry G. Black et al., J. Vac. Sci. Technol. B 5(1), Jan./Feb. 1987, pp. 419–422.

"On the Applications of Laser-Direct-Writing Techniques, to GaAs Monolithic Microwave Integrated Circuits", C. L. Chen et al., GaAs IC Symposium, IEEE 1987, pp. 167-170.

"Selective Electroless Metal Deposition for Integrated Circuit Fabrication", Chiu H. Ting et al., J. Electrochem. Soc., Vo. 136, No. 2, Feb. 1989, pp. 456–462.

Primary Examiner—Olik Chaudhuri
Assistant Examiner—David E. Graybill
Attorney, Agent, or Firm—Andrus, Sceales, Starke & Sawall

[57] ABSTRACT

A semiconductor chip (14) is bonded to a substrate (16) by a metallic molecular bond interface (28, 38, 30). The chip and the substrate are separated by a gap (18), and a metal-bearing gas is introduced in the gap. A thermal energy source (22) directs a focused energy beam (24) into the gap to thermally decompose the gas by chemical vapor reaction to deposit and grow metal to provide a metallic molecular bond interface filling the gap and bonding the chip to the substrate. In the preferred embodiment, one of the chip and substrate has a passband passing the wavelength of the focused beam to be transparent thereto such that the beam passes therethrough and into the gap and against the other of the chip and the substrate.

10 Claims, 2 Drawing Sheets

LOW TEMPERATURE SEMICONDUCTOR BONDING PROCESS WITH CHEMICAL VAPOR REACTION

BACKGROUND AND SUMMARY

The invention relates to semiconductor processing methods, and more particularly to a low temperature process.

The invention provides reliable, uniform, repeatable and void-free semiconductor bonding using a low temperature process. The invention achieves molecular bonding of two closely spaced surfaces through a chemical vapor reaction that results in the deposition and growth of a metallic element to provide the bonding. The molecular bonding is achieved without the need of any fluxes or undesirable high temperatures otherwise required by present methodologies. In addition, the invention eliminates contamination of devices and circuits, is cost effective, and provides high yield.

It is known in the prior art to use chemical vapor deposition to define metal lines on a surface: "Laser-Direct-Writing Processes: Metal Deposition, Etching, and Applications to Microcircuits", Jerry G. Black et al, J. Vac. Sci. Technol. B 5(1), Jan/Feb 1987, pages 419-422; "On The Applications of Laser-Direct-Writing Techniques, To GaAs Monolithic Microwave Integrated Circuits", C. L. Chen et al, GaAs IC Symposium, IEEE 1987, pages 167-170; "Selective Electroless Metal Deposition for Integrated Circuit Fabrication", Chiu H. Ting et al, J. Electrochem. Soc., Vol. 136, No. 2, February 1989, pages 456-462. The present invention enables use of this technology to provide a metallic molecular bond interface bonding a semiconductor chip to a substrate.

DETAILED DESCRIPTION

Figure 1:
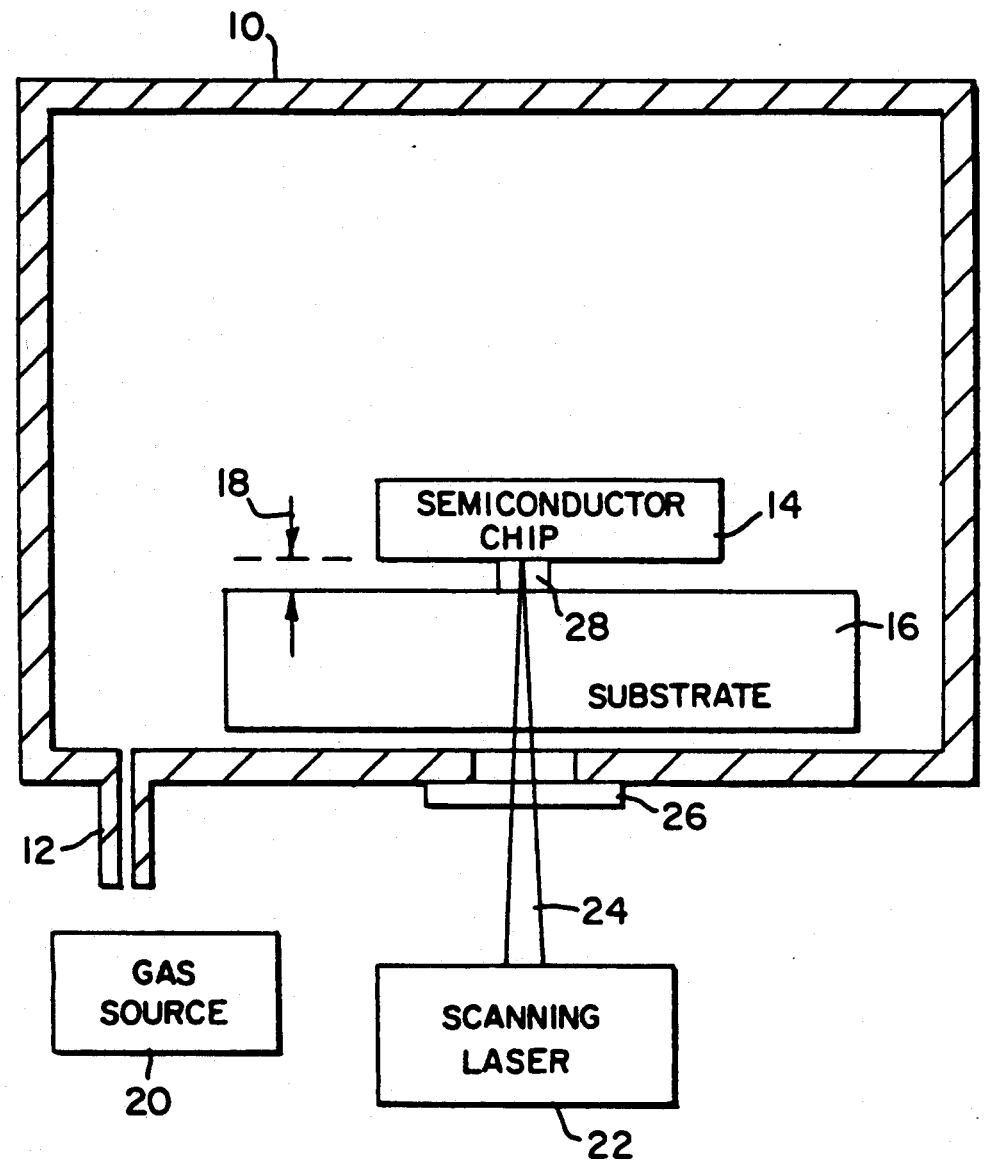
FIG. 1 illustrates a semiconductor processing technique in accordance with the invention.

FIG. 1 shows a processing chamber 10 having a port 12 for introducing gas. Semiconductor chip 14 is separated from substrate 16 by a 5 to 100 micron gap 18. A metal-bearing gas is introduced from gas source 20 into chamber 10, including in gap 18 between semiconductor chip 14 and substrate 16. A scanning laser 22 has a focused energy beam 24 directed through window 26 into chamber 10 and into gap 18 to thermally decompose the metal-bearing gas by chemical vapor reaction to deposit and grow metal to provide a metallic molecular bond interface 28 filling gap 18 and bonding chip 14 to substrate 16.

Figure 3:
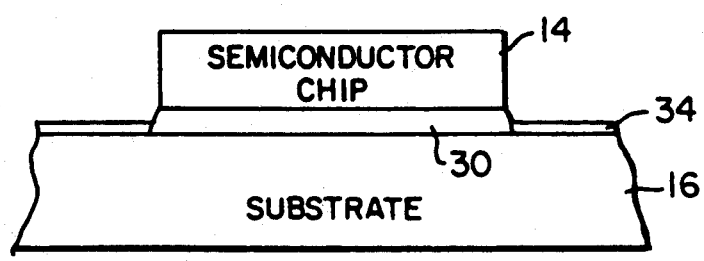
FIG. 3 shows the resultant molecular bond in accordance with the invention.

The method is conducted substantially at room temperature except at the localized interface 28 impinged by beam 24 and which is locally heated thereby to a temperature up to about 200° C. Thermal energy source 22 may alternatively be an x-ray source, an ion beam source, or an electron beam source. Deposition and growth of the metallic element is initiated at the center of chip 14, and beam 24 is then scanned across the surface of the chip to provide a wide area molecular bond interface 30, FIG. 3, bonding chip 14 to substrate 16 over a wide area. Beam 24 has a given wavelength, and substrate 16 has a passband passing such wavelength such that substrate 16 is optically transparent to such beam.

Beam 24 is directed through substrate 16 and into gap 18 and preferably substantially perpendicularly against the surface of chip 14. Alternatively, chip 14 can have a passband passing beam 24 therethrough against substrate 16. Silicon and gallium arsenide have passbands in the range of 1-6 microns, and hence energy source 22 is selected accordingly. For example, in one embodiment an argon scanning laser is used. Other substrate materials include $Al_2O_3$ and AlN.

Figure 2:
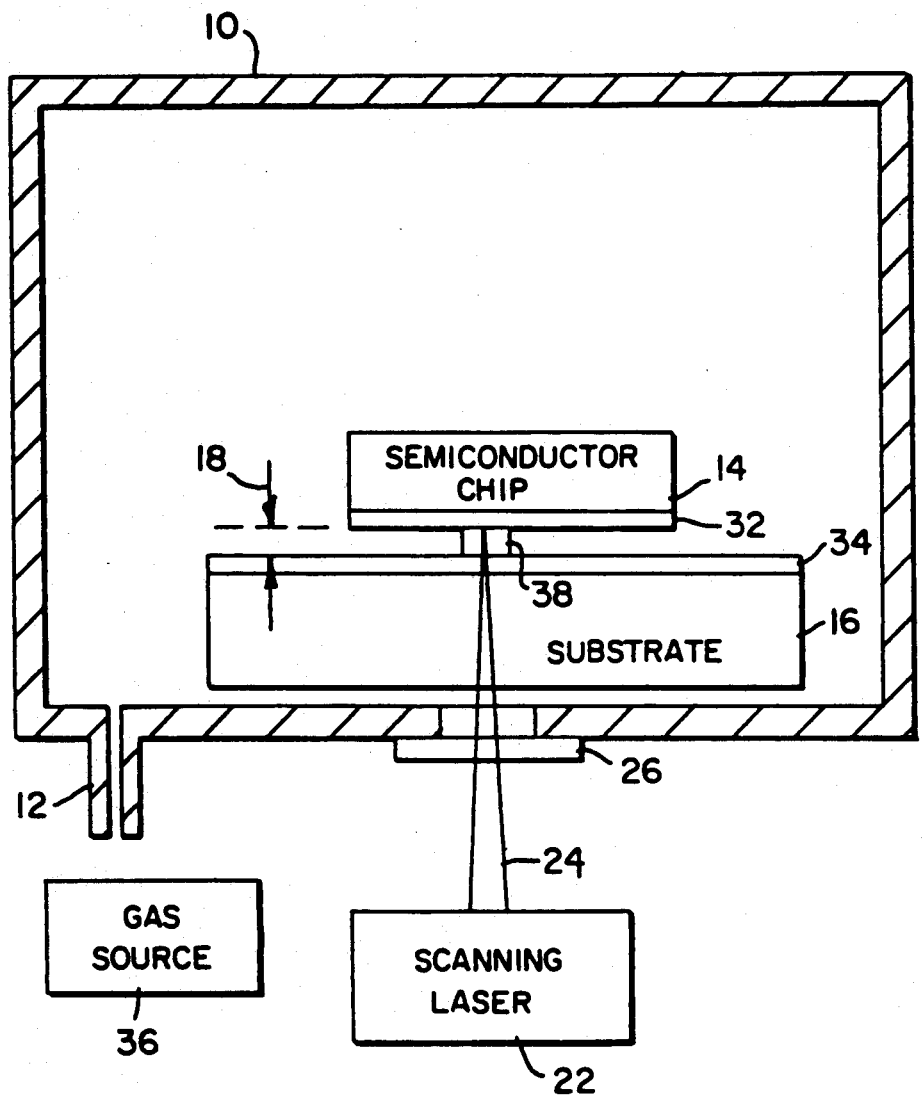
FIG. 2 shows a further embodiment.

FIG. 2 shows a preferred embodiment, and uses like reference numerals from FIG. 1 where appropriate to facilitate understanding. One or both of semiconductor chip 14 and substrate 16 is provided with a silicon surface as shown at 32 and 34, if the respective material is not already silicon. $WF_6$ gas is introduced from source 36 into chamber 10, including in gap 18. Laser beam 24 is directed through window 26 and through optically transparent substrate 16 and into gap 18 against chip 14 to initiate by localized heating the chemical vapor reaction

$$2WF_6 + 3Si + heat \rightarrow 2W + 3SiF_4$$

to deposit and grow tungsten to provide a tungsten molecular bond interface 38 filling gap 18 and bonding chip 14 to substrate 16. Beam 24 is scanned across chip 14 to provide a wide area molecular bond interface as shown at 30 in FIG. 3. Other metals for the molecular bond interface may be selected from the group consisting of Ni, Pd, Ag, Cu, Au, and Co.

It is recognized that various equivalents, alternatives and modifications are possible within the scope of the appended claims.

We claim:

1. A method for bonding a semiconductor chip to a substrate, comprising:
   providing a semiconductor chip;
   providing a substrate;
   separating said chip and said substrate by a gap;
   introducing a metal-bearing gas in said gap;
   providing a thermal energy source having a focused energy beam;
   directing said beam into said gap to thermally decompose said gas by chemical vapor reaction to deposit and grow metal to provide a metallic molecular bond interface filling said gap and bonding said chip to said substrate.

2. The invention according to claim 1 comprising conducting said method substantially at room temperature except at the localized interface impinged by said beam which is locally heated thereby to a temperature less than about 200° C.

3. The invention according to claim 1 wherein said gap is 5 to 100 microns.

4. The invention according to claim 1 comprising providing a scanning said source, and scanning said focused beam to provide a wide area molecular bond interface bonding said chip to said substrate over a wide area.

5. The invention according to claim 1 wherein said focused beam has a wavelength, and wherein one of said chip and said substrate has a passband passing said wavelength such that said one of said chip and said substrate is transparent to said beam, and comprising directing said beam through said one of said chip and said substrate and into said gap and against the other of said chip and said substrate.

6. The invention according to claim 5 comprising directing said beam substantially perpendicularly against said other of said chip and said substrate.

7. The invention according to claim 5 wherein said substrate is transparent to said beam, and comprising directing said beam through said substrate and into said gap and against said chip.

8. The invention according to claim 1 wherein said metal is selected from the group consisting of W, Ni, Pd, Ag, Cu, Au, and Co.

9. The invention according to claim 1 wherein said source is selected from the group consisting of a laser, an x-ray source, an ion beam source, and an electron beam source.

10. A method for bonding a semiconductor chip to a substrate, comprising:
    providing a semiconductor chip;
    providing a substrate;
    separating said chip and said substrate by a gap, at least one of said chip and said substrate having a silicon surface facing the other of said chip and said substrate across said gap;
    introducing $WF_6$ gas in said gap;
    providing a thermal energy source having a focused energy beam;
    directing said beam into said gap to thermally initiate by localized heating the chemical vapor reaction $$2WF_6 + 3Si + heat \rightarrow 2W + 3SiF_4$$

to deposit and grow tungsten to provide a tungsten molecular bond interface filling said gap and bonding said chip to said substrate.

* * * * *